(12) United States Patent
Chou et al.

(10) Patent No.: US 11,088,254 B2
(45) Date of Patent: Aug. 10, 2021

(54) SEMICONDUCTOR DEVICE AND METHOD OF MANUFACTURING THE SAME

(71) Applicant: NANYA TECHNOLOGY CORPORATION, New Taipei (TW)

(72) Inventors: Yi-Hsien Chou, Taoyuan (TW); Chen-Hsien Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/739,922

(22) Filed: Jan. 10, 2020

(65) Prior Publication Data

US 2021/0217864 A1   Jul. 15, 2021

(51) Int. Cl.
| | |
|---|---|
| *H01L 29/423* | (2006.01) |
| *H01L 29/10* | (2006.01) |
| *H01L 29/66* | (2006.01) |
| *H01L 29/40* | (2006.01) |

(52) U.S. Cl.
CPC ...... *H01L 29/4236* (2013.01); *H01L 29/1033* (2013.01); *H01L 29/401* (2013.01); *H01L 29/407* (2013.01); *H01L 29/66477* (2013.01)

(58) Field of Classification Search
CPC .............. H01L 29/4236; H01L 29/407; H01L 29/1033; H01L 29/401; H01L 29/66477; H01L 29/66348
See application file for complete search history.

(56) References Cited

U.S. PATENT DOCUMENTS

| | | | | |
|---|---|---|---|---|
| 2005/0242392 A1* | 11/2005 | Pattanayak | ....... | H01L 29/66734 257/328 |
| 2005/0263853 A1* | 12/2005 | Tomomatsu | ........ | H01L 29/7397 257/565 |
| 2012/0098059 A1* | 4/2012 | Tai | .................... | H01L 29/66734 257/330 |
| 2016/0268181 A1* | 9/2016 | Yasuhara | ................ | H01L 29/51 |
| 2019/0074367 A1* | 3/2019 | Naito | ................ | H01L 29/66136 |
| 2019/0115439 A1* | 4/2019 | Utsumi | ........... | H01L 21/823443 |

FOREIGN PATENT DOCUMENTS

CN          103165669 A       6/2013

OTHER PUBLICATIONS

Office Action (with Search Report attached) issued in corresponding ROC application No. 109139522, dated Mar. 9, 2021 (3 pages).

* cited by examiner

*Primary Examiner* — Changhyun Yi
(74) *Attorney, Agent, or Firm* — Muncy, Geissler, Olds & Lowe, P.C.

(57) ABSTRACT

The present disclosure provides a semiconductor device including a recessed access device (RAD) transistor and a method of manufacturing the semiconductor device. The semiconductor device includes a substrate, a gate electrode, and a plurality of impurity regions. The substrate includes a buried layer. The gate electrode is disposed in the substrate and penetrates through the buried layer. The plurality of impurity regions are disposed in the substrate and on either side of the gate electrode.

11 Claims, 12 Drawing Sheets

SEMICONDUCTOR DEVICE AND METHOD OF MANUFACTURING THE SAME

TECHNICAL FIELD

The present disclosure relates to a semiconductor device and a method of manufacturing the same, and more particularly, to a semiconductor device including a recessed access device (RAD) transistor and a method of manufacturing the same.

DISCUSSION OF THE BACKGROUND

Manufacture of various semiconductor devices, such as memory devices, logic devices and microprocessors, has the common goal of miniaturization. As feature sizes decrease, the electrical operation of the transistor becomes more difficult. One contributing factor to such difficulty, the short channel effect, arises when the width of the transistor channel becomes excessively small due to miniaturization. This may result in the transistor activating even though a threshold voltage (Vt) has not been applied to the gate.

A new type of transistor, known as a recessed access device (RAD) transistor, has been developed to overcome the short channel effect suffered by conventional transistors by forming a wider channel in the same horizontal space. The RAD transistor comprises a transistor gate (word line) that is partially formed within a trench in a semiconductor wafer. The channel region is formed along the entire surface of the trench which, in effect, provides a wider channel without increasing the lateral space required by the transistor. However, with increasing DRAM bit density, the overlay between transistor gates and the source/drain junction depth create a challenge due to variations in the etching process.

Specifically, in order to precisely control the etch depth of the trench, the etching process must be closely monitored by periodically interrupting it to measure the etched depth in the semiconductor wafer and estimating the etching process time remaining to reach the target depth based upon the elapsed etching process time. However, the estimation of remaining etching time to reach the desired depth is based on an assumption that the etching rate remains consistent, and therefore produces an unreliable estimate. The problems of such a cumbersome procedure include low productivity and high cost as well as increased opportunity for introduction of contamination or faults in the photoresist pattern.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides semiconductor device. The semiconductor device includes a substrate, a gate electrode and a plurality of impurity regions. The substrate includes a buried layer. The gate electrode is disposed in the substrate and penetrates through the buried layer. The plurality of impurity regions are disposed in the substrate and on either side of the gate electrode.

In some embodiments, the semiconductor device further includes a dummy electrode disposed in the substrate, wherein the buried layer is exposed through the dummy electrode.

In some embodiments, a width of the dummy electrode is greater than a width of the gate electrode.

In some embodiments, the semiconductor device further includes a capping layer covering the gate electrode and the dummy electrode and contacting the buried layer exposed through the dummy electrode.

In some embodiments, the dummy electrode is disposed in a peripheral area laterally enclosing an active area in which the gate electrode is disposed, and the substrate extends to comprise the peripheral area and the active area.

In some embodiments, the semiconductor device further includes a dielectric liner interposed between the gate electrode and the substrate and between the dummy electrode and the substrate, wherein the dielectric liner in the active area further contacts the buried layers.

In some embodiments, the impurity regions contact the buried layer.

In some embodiments, a dopant concentration of the buried layer is greater than a dopant concentration of the impurity regions.

In some embodiments, a thickness of the buried layer is less than a distance between upper surfaces of the substrate and the buried layer.

Another aspect of the present disclosure provides a method of manufacturing a semiconductor device. The method includes steps of forming a buried layer in a substrate; creating a plurality of first trenches and at least one second trench in the substrate and penetrating through the buried layer, wherein an aspect ratio of the first trenches is greater than an aspect ratio of the second trench; depositing an electrode layer to fill the first trenches and the second trench; recessing the electrode layer until the buried layer is exposed; and introducing dopants into the substrate to form impurity regions on the buried layer.

In some embodiments, the method further includes a step of depositing a capping layer to cover the electrode layer after the recessing of the electrode layer.

In some embodiments, the buried layer is preferentially exposed through the electrode layer filling the second trench.

In some embodiments, the buried layer is formed by implanting dopants into the substrate.

In some embodiments, the method further includes steps of conformally depositing a dielectric film on the exposed substrate after the creating of the first trenches and the second trench; and conformally depositing a diffusion barrier layer on the dielectric film.

In some embodiments, the creating of the first trenches and the second trench includes steps of forming a sacrificial layer comprising a plurality of first openings and at least one second opening to expose portions of an upper surface of the substrate; etching the substrate through the first openings and the second opening to form the first trenches and the second trench; and removing the sacrificial layer after the deposition of the electrode layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
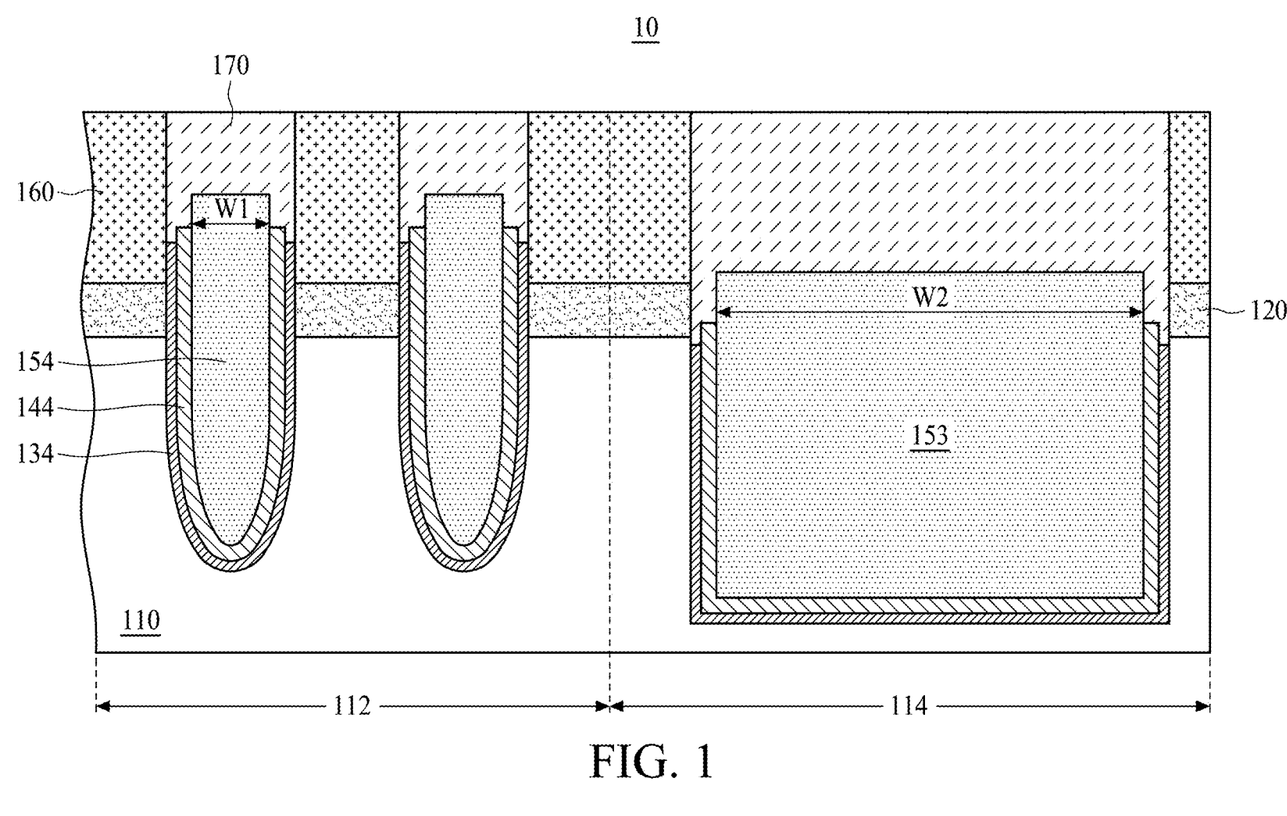
FIG. 1 is a cross-sectional view of a semiconductor device in accordance with some embodiments of the present disclosure.

FIG. 1 is a cross-sectional view of a semiconductor device in accordance with some embodiments of the present disclosure. Referring to FIG. 1, the semiconductor device 10 includes a semiconductor substrate 110, a buried layer 120 in the semiconductor substrate 110, a plurality of gate electrodes 154 penetrating through the buried layer 120, and a plurality of impurity regions 160 disposed on either side of the gate electrodes 154. The semiconductor device 10 may be a recessed access device (RAD) transistor including the gate electrode 154 formed within the semiconductor substrate 110. In some embodiments, the impurity regions 160 can contact the buried layer 120 if the dopant type and/or dopant concentration of the buried layer 120 and the impurity regions 160 are different.

The semiconductor device 10 further includes a dummy electrode 153 disposed in the semiconductor substrate 110 and penetrating through the buried layer 120. In some embodiments, the dummy electrode 153 is located in a peripheral area 114, which laterally encloses an active area 112 in which the gate electrodes 154 are located, wherein the semiconductor substrate 110 extends to comprise the active area 112 and the peripheral area 114.

The semiconductor device 10 also includes a capping layer 170 covering the gate electrodes 154 for protecting the gate electrodes 154. In some embodiments, the capping layer 170 further covers the dummy electrode 153 and contacts the buried layer 120 in the peripheral area 114.

The semiconductor device 10 may also include a dielectric liner 134 and a diffusion barrier liner 144. The dielectric liner 134 is interposed between the semiconductor substrate 110 and the gate electrodes 154 and between the semiconductor substrate 110 and the dummy electrode 153. The diffusion barrier liner 144 is sandwiched between the dielectric liner 134 and the gate electrodes 154 and between the dielectric liner 134 and the dummy electrode 153. The diffusion barrier liner 134, used to facilitate improved quality control of the growing of the gate electrode 154 and the dummy electrode 153, is optional.

Figure 2:
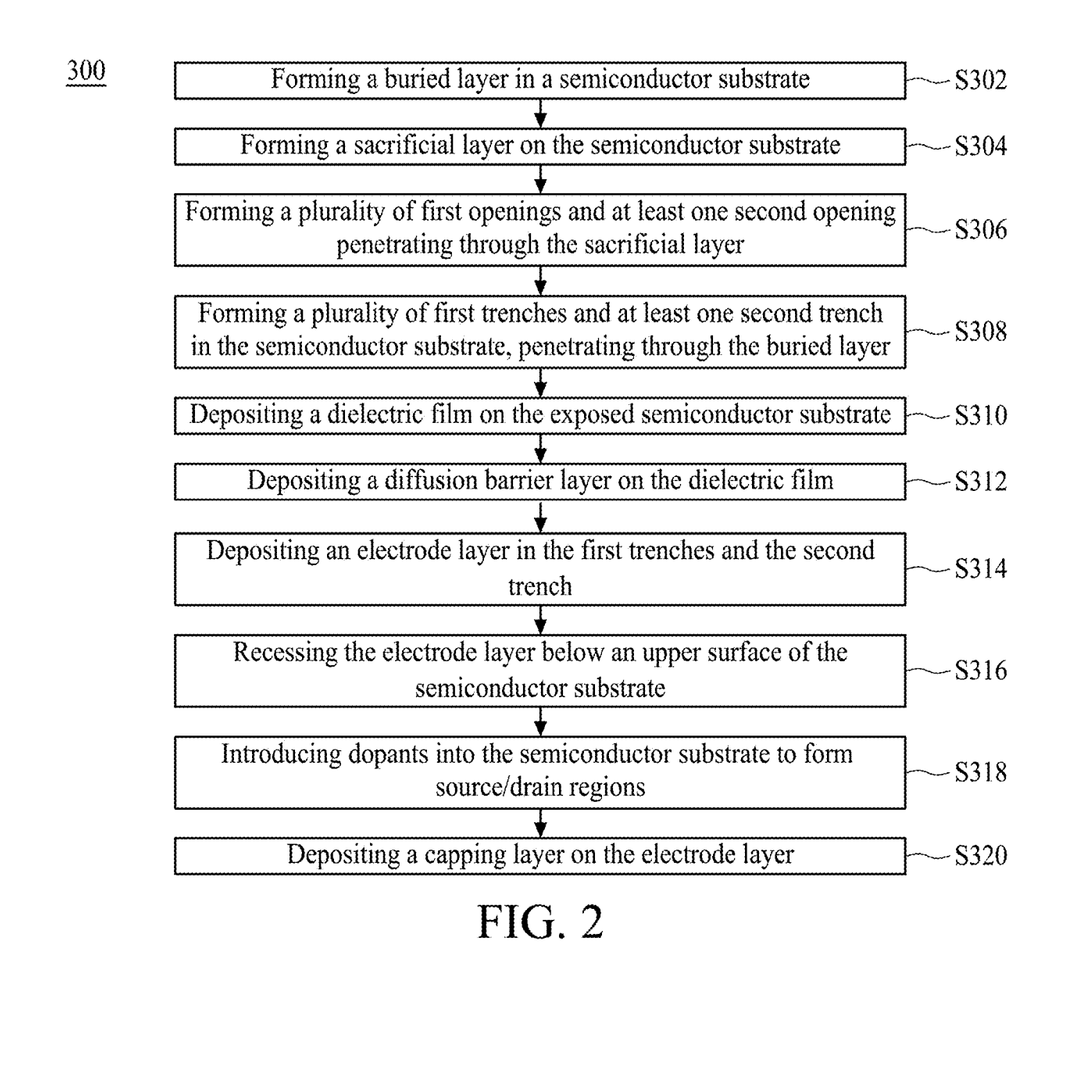
FIG. 2 is a flow diagram illustrating a method of manufacturing a semiconductor device in accordance with some embodiments of the present disclosure.

FIG. 2 is a flow diagram illustrating a method 300 of manufacturing a semiconductor device in accordance with some embodiments of the present disclosure, and FIGS. 3 through 12 illustrate cross-sectional views of intermediate stages in the formation of a semiconductor device in accordance with some embodiments of the present disclosure. The stages shown in FIGS. 3 to 12 are also illustrated schematically in the flow diagram in FIG. 2. In the subsequent discussion, the fabrication stages shown in FIGS. 3 to 12 are discussed in reference to the process steps shown in FIG. 2.

Figure 3:
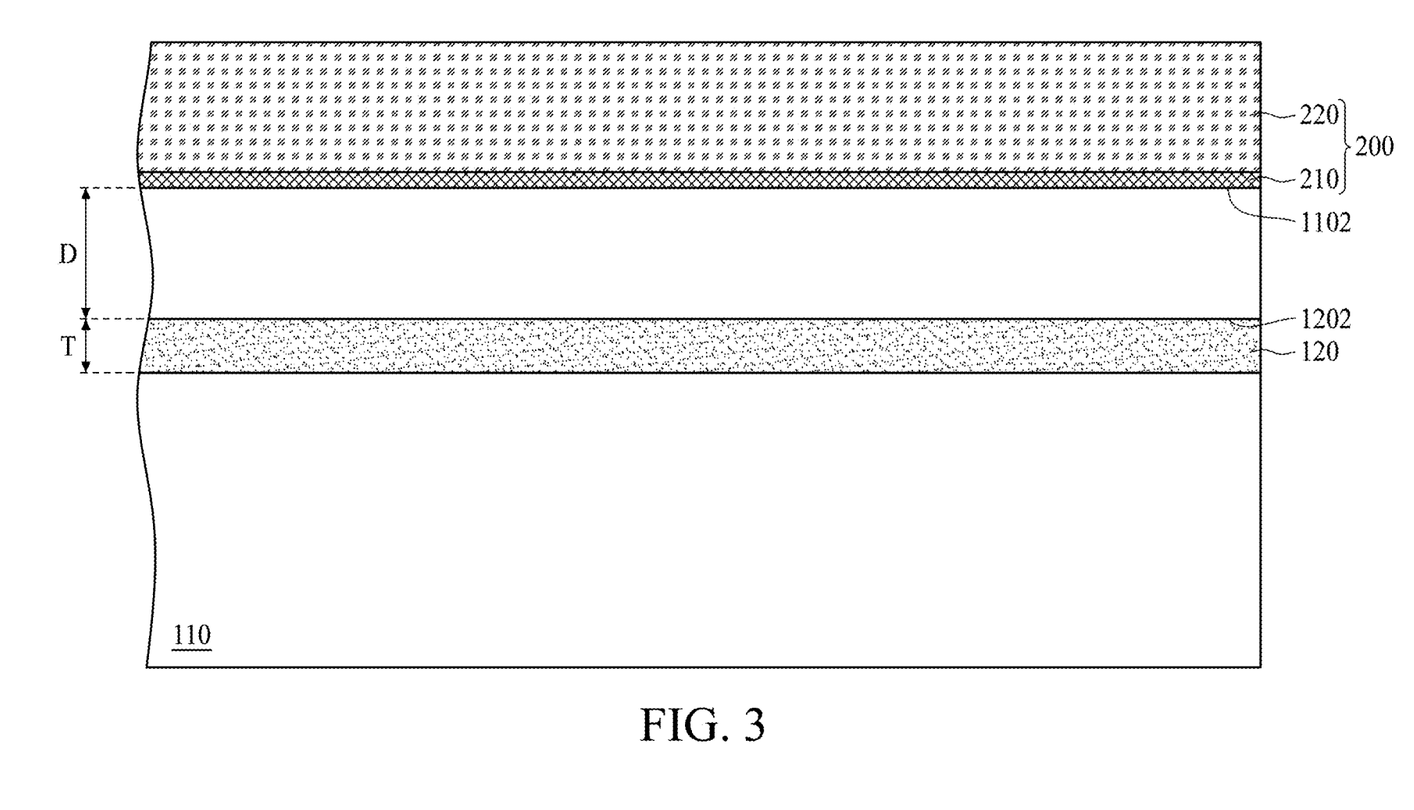
FIGS. 3 through 12 illustrate cross-sectional views of intermediate stages in the formation of a semiconductor device in accordance with some embodiments of the present disclosure.

Referring to FIG. 3, a buried layer 120 is formed in a semiconductor substrate 110 according to a step S302 in FIG. 2. The buried layer 120 is formed by implanting dopants into the semiconductor substrate 110. The implanted dopants can break down the lattice structure of the semiconductor substrate 110 in order to control the depth of the subsequent partial electrode removal. In some embodiments, the buried region 120 may also be used for controlling the depth of the subsequent source/drain implantation.

In some embodiments, the buried layer 120 can include group IV elements, such as carbon. In alternative embodiments, the dopants may be a p-type dopant selected from group III elements or an n-type dopant selected from group V elements. As shown in FIG. 3, the buried layer 120 has a thickness T, which is less than a distance D from an upper surface 1102 of the semiconductor substrate 110 to an upper surface 1202 of the buried layer 120. In some embodiments, after the implantation, an annealing process may be performed to drive the implanted dopants to diffuse to a desirable depth.

Next, a sacrificial layer 200 is formed on the semiconductor substrate 110 according to a step S304 in FIG. 2. The sacrificial layer 200 includes an underlying layer 210 and an overlying layer 220 sequentially formed on the semiconductor substrate 110. The underlying layer 210, formed on the entire upper surface 1102 of the semiconductor substrate 110, protects against contamination and functions as a buffer layer for mitigating stress at the interface between the semiconductor substrate 110 and the overlying layer 220. The underlying layer 210 may be a deposition layer or an oxidized layer including silicon oxide or silicon dioxide. The overlying layer 220 may include any dielectric, such as silicon dioxide, silicon nitride, another suitable dielectric material or a combination thereof. The underlying layer 210 can be formed using a chemical vapor deposition (CVD) process or a thermal oxidation process, wherein the thermally grown oxides can display a higher level of purity than the deposited oxides. The overlying layer 220 is formed using a low-pressure CVD process.

Figure 4:
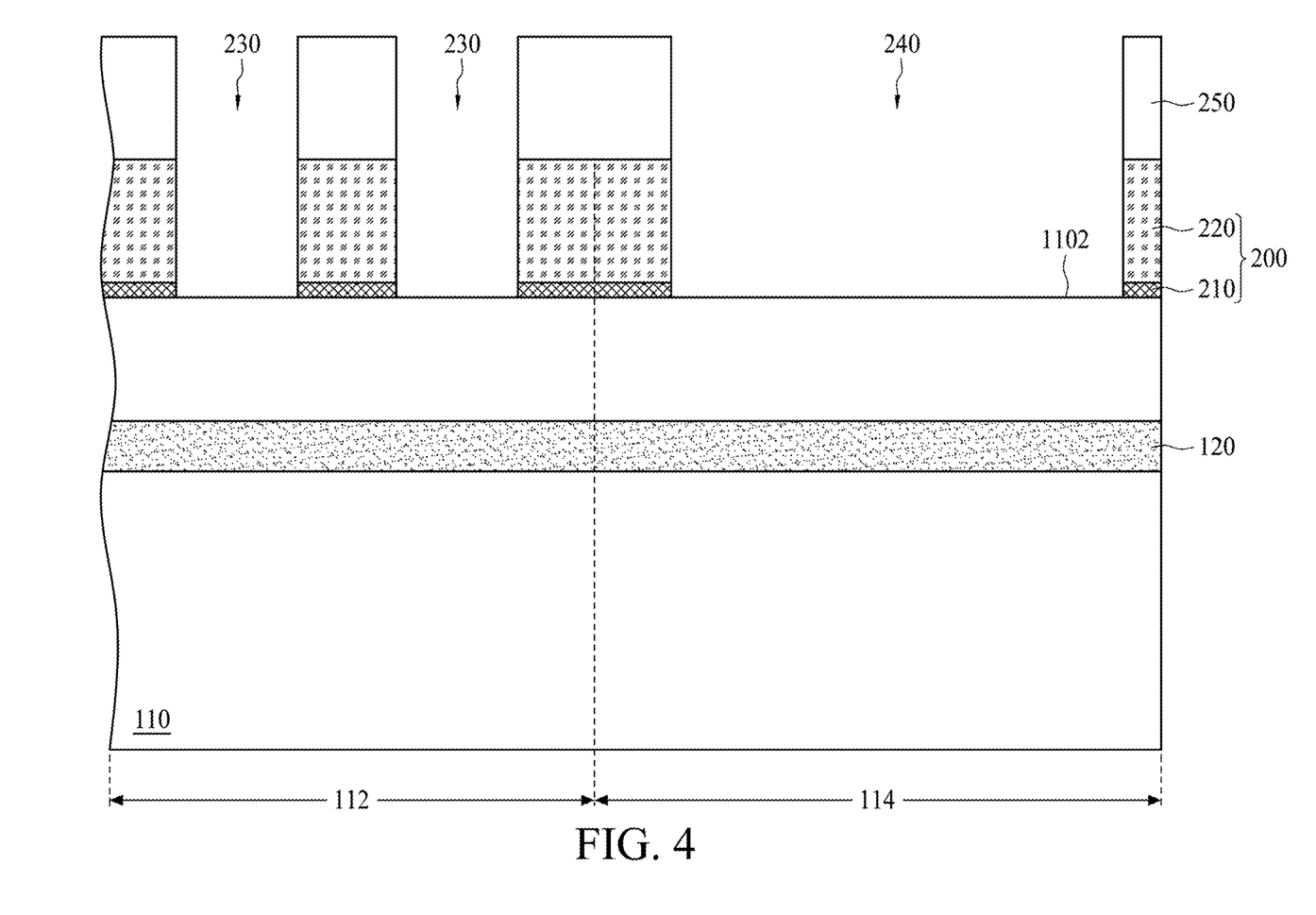

Referring to FIG. 4, a plurality of first openings 230 and one or more second openings 240 are formed in the sacrificial layer 200 to expose portions of the semiconductor substrate 110 according to a step S306 in FIG. 2. The first openings 230 are created over the area reserved for an active area 112, in which main components, such as transistors, are formed, while the second openings 240 are created over the area reserved for a peripheral area 114, which laterally encloses the active area 112. The semiconductor substrate 110 extends to include the active area 112 and the peripheral area 114. In some embodiments, the peripheral area 114 may include peripheral circuits configured to control or operate the main components. In alternative embodiments, one or more scribe lines may be located in the peripheral area 114.

The forming of the first openings 230 and the second openings 240 includes steps of coating a patterned mask 250, such as photoresist, on the sacrificial layer 200 that leaves portions of the overlying layer 220 exposed, and performing at least one etching process to remove the portions of the sacrificial layer 200 not protected by the patterned mask 250. In should be noted that the etching process may utilize multiple etchants, selected based on the materials of the overlying layer 220 and the underlying layer 210, to etch the sacrificial layer 200. The patterned mask 250 is removed after the performing of the etching process using an ashing process or a wet strip process, for example.

Figure 5:
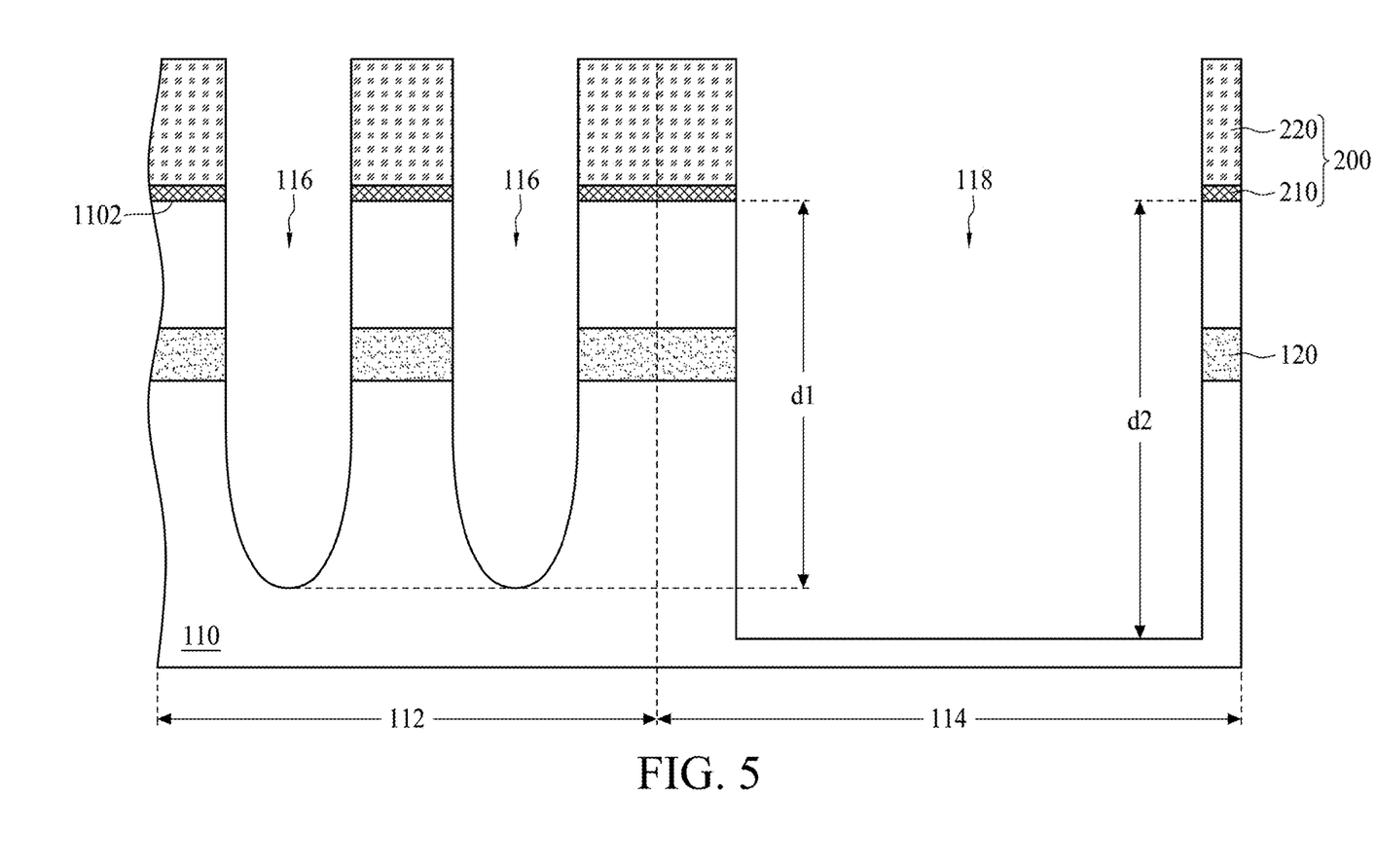

Referring to FIG. 5, a plurality of first trenches 116 and one or more second trenches 118 are formed in the semiconductor substrate 110 and penetrate through the buried layer 120 according to a step S308 in FIG. 2. The semiconductor substrate 110 is anisotropically dry-etched, using a reactive ion etching (RIE) process, for example, through the first openings 230 and the second openings 240 to form the first trenches 116 in the active area 112 and the second trenches 118 in the peripheral area 114.

The sizes (or "widths") of the first opening 230 and the second opening 240 can be controlled to adjust the etching depths of the first trenches 116 and the second trenches 118. More particularly, the etching depth decreases with decreasing width because of the RIE lag effect. As shown in FIG. 5, the first trenches 116 have a first depth d1 from the upper surface 1102 of the semiconductor substrate 110, and the second trenches 118 have a second depth d2 greater than the first depth d1 since the width of the first opening 230 is less than the width of the second opening 240. In some embodiments, an aspect ratio of the first trenches 116 is greater than that of the second trenches 118.

Figure 6:
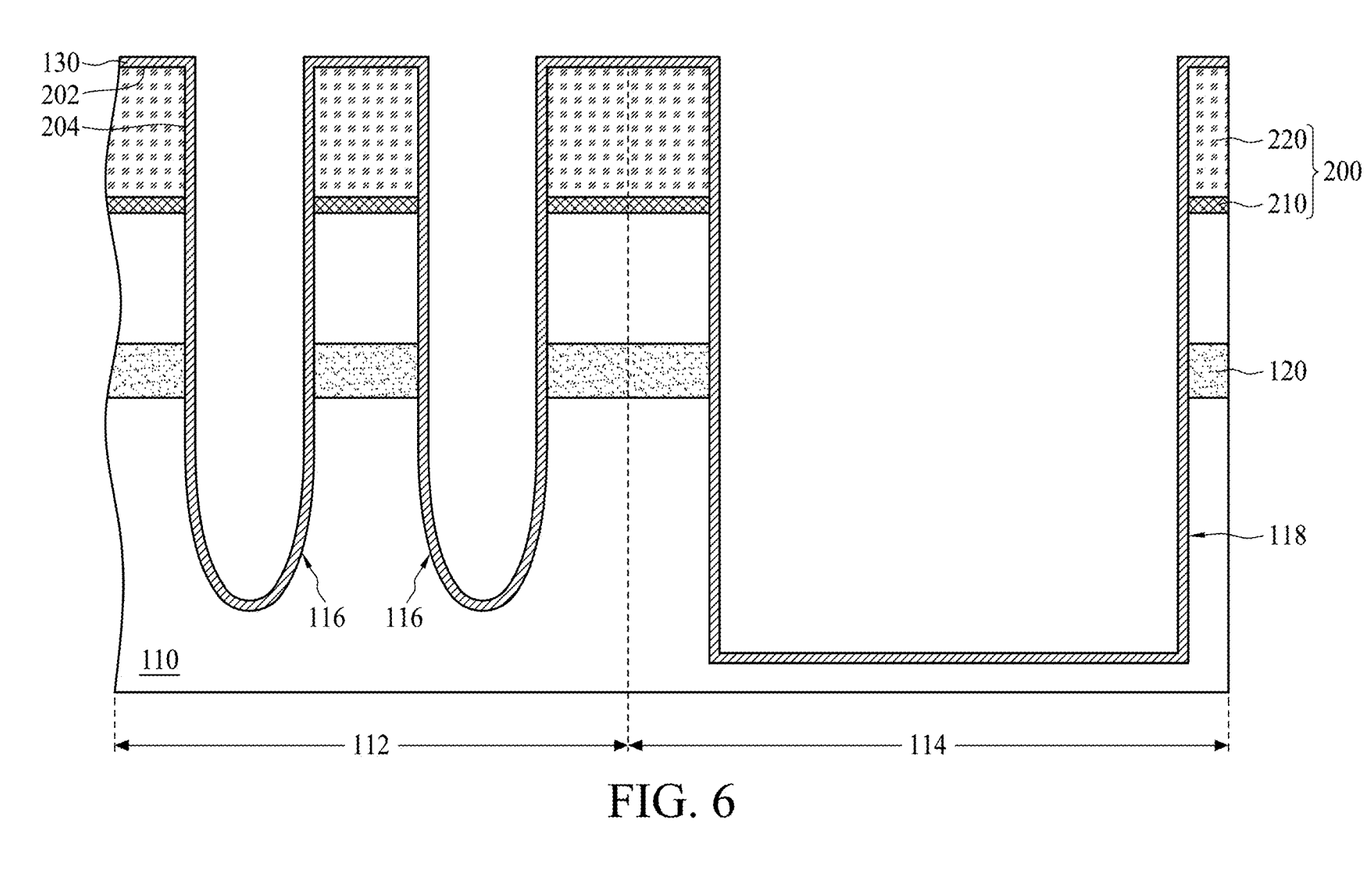

Referring to FIG. 6, a dielectric film 130 is deposited on the exposed semiconductor substrate 110 according to a step S310 in FIG. 2. In some embodiments, the dielectric film 130 is conformally grown within the first trenches 116 and the second trenches 118 and over a topmost surface 202 of the sacrificial layer 200 and lateral surfaces 204 adjacent to the topmost surface 202. The lateral surfaces 204 of the sacrificial layer 200 are interfaced with the first openings 230 and the second openings 240. The dielectric film 130 has a substantially uniform thickness. By way of example, the dielectric film 130 includes oxide, nitride, oxynitride or high-k material and can be formed using a CVD process, an atomic layer deposition (ALD) process, or the like.

Figure 7:
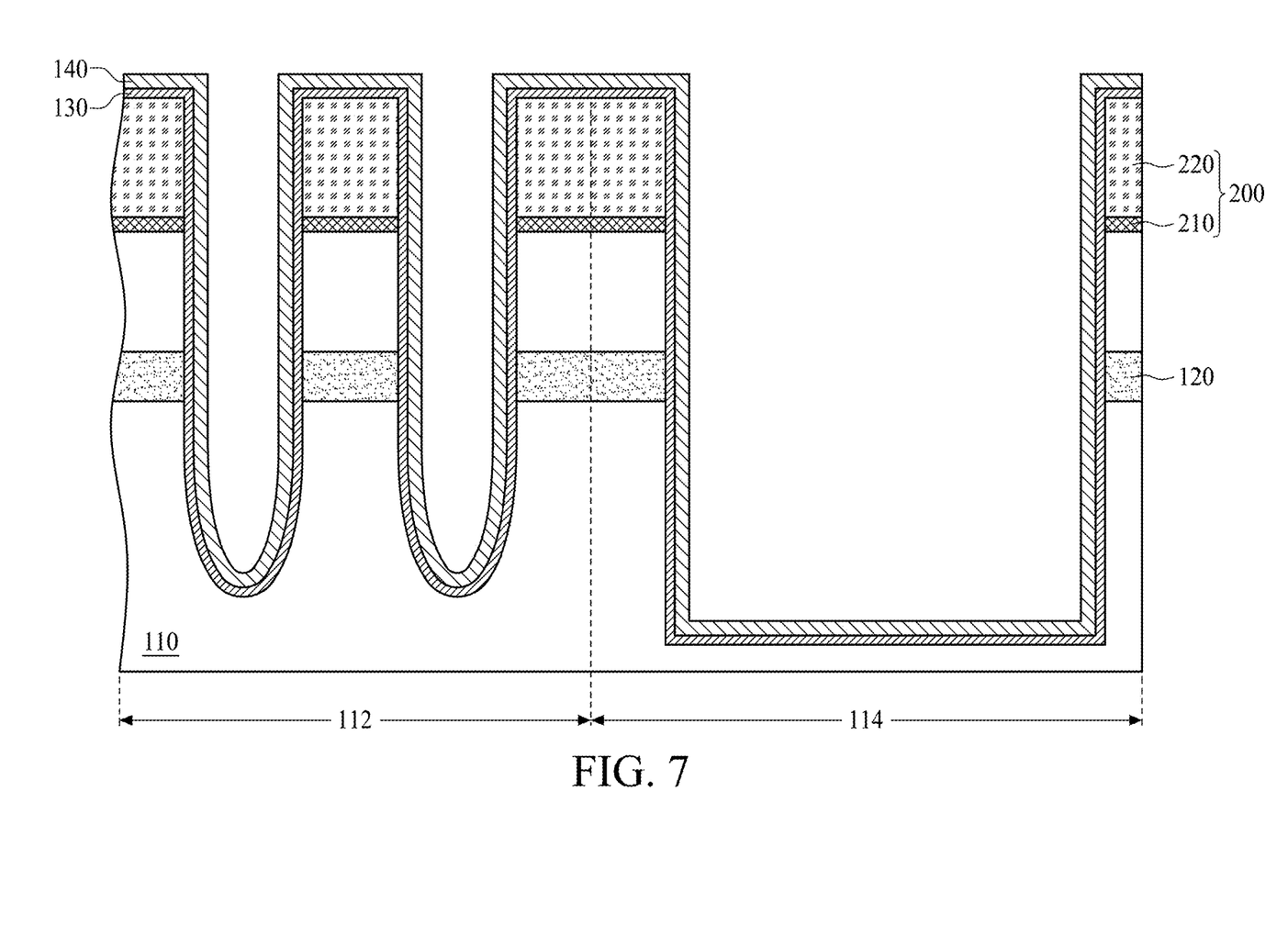

Referring to FIG. 7, in some embodiments, a diffusion barrier layer 140 is optionally deposited on the dielectric film 130 according to a step S312 in FIG. 2. The diffusion barrier layer 140 achieves a good adhesion to the dielectric film 130 and the semiconductor substrate 110, thereby preventing the subsequent electrode deposition from flaking or spalling from the dielectric film 130 and the semiconductor substrate 110. The diffusion barrier layer 140 is a substantially conformal layer and is formed using a physical vapor deposition (PVD) process, for example. In some embodiments, the diffusion barrier layer 140 may be a single-layered structure including refractory metals (such as tantalum and titanium), refractory metal nitrides, or refractory metal silicon nitrides. In alternative embodiments, the diffusion barrier layer 140 may comprise a multi-layered structure including one or more refractory metals, refractory metal nitrides, or refractory metal silicon nitrides.

Figure 8:
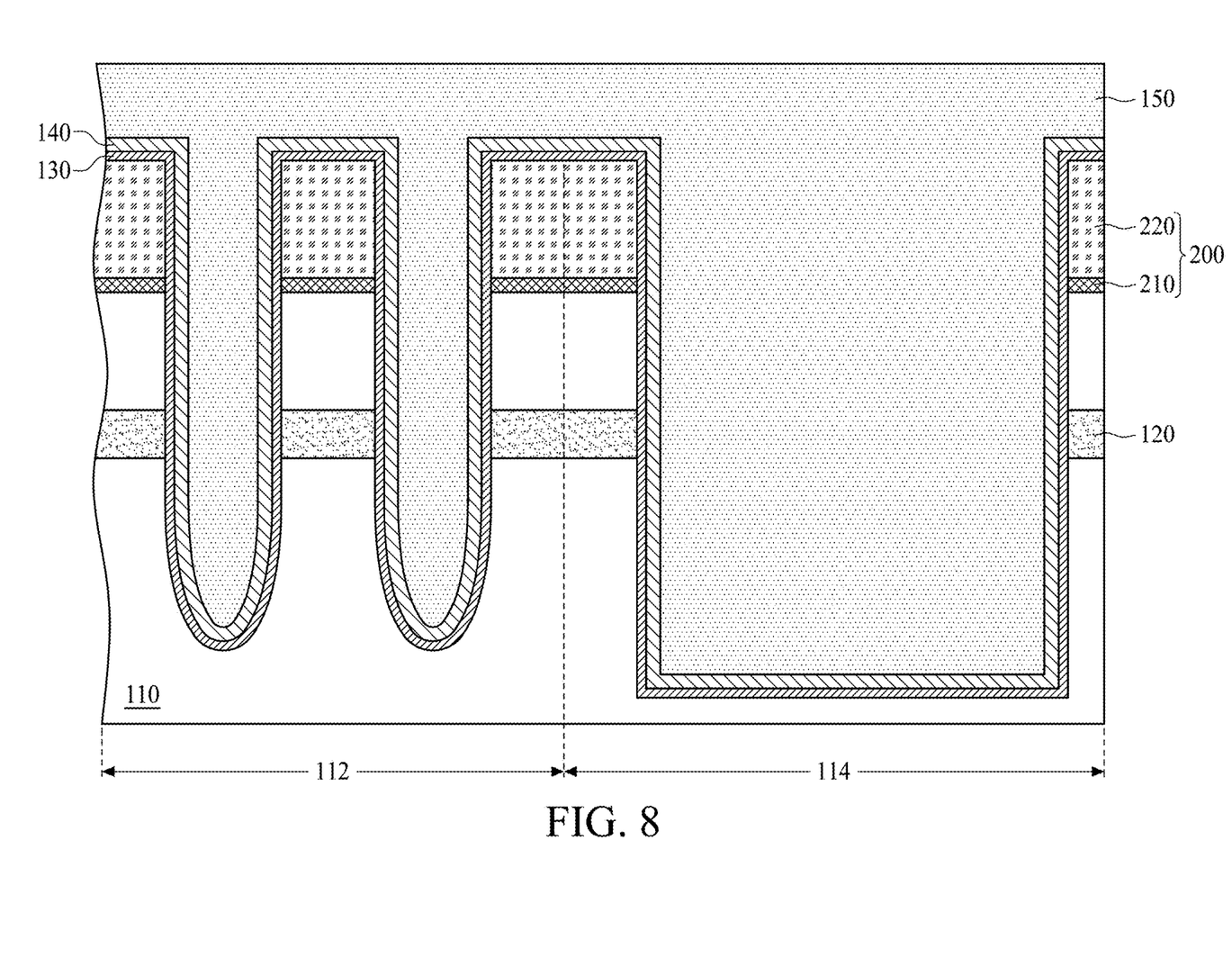

Referring to FIG. 8, an electrode layer 150 is deposited in the first trenches 116 and the second trenches 118, which are coated with the dielectric film 130 (and the diffusion barrier layer 140) according to a step S314 in FIG. 2. The electrode layer 150 has a sufficient thickness to fill the first trenches 116 and the second trenches 118 and cover the exposed dielectric layer 130 (or the exposed diffusion barrier layer 140). The electrode layer 150 includes polysilicon or metal, such as tungsten, aluminum, copper, molybdenum, titanium, tantalum, ruthenium, or a combination thereof. The electrode layer 150 may be formed using a CVD process, a PVD process, an ALD process or another suitable process.

Figure 9:
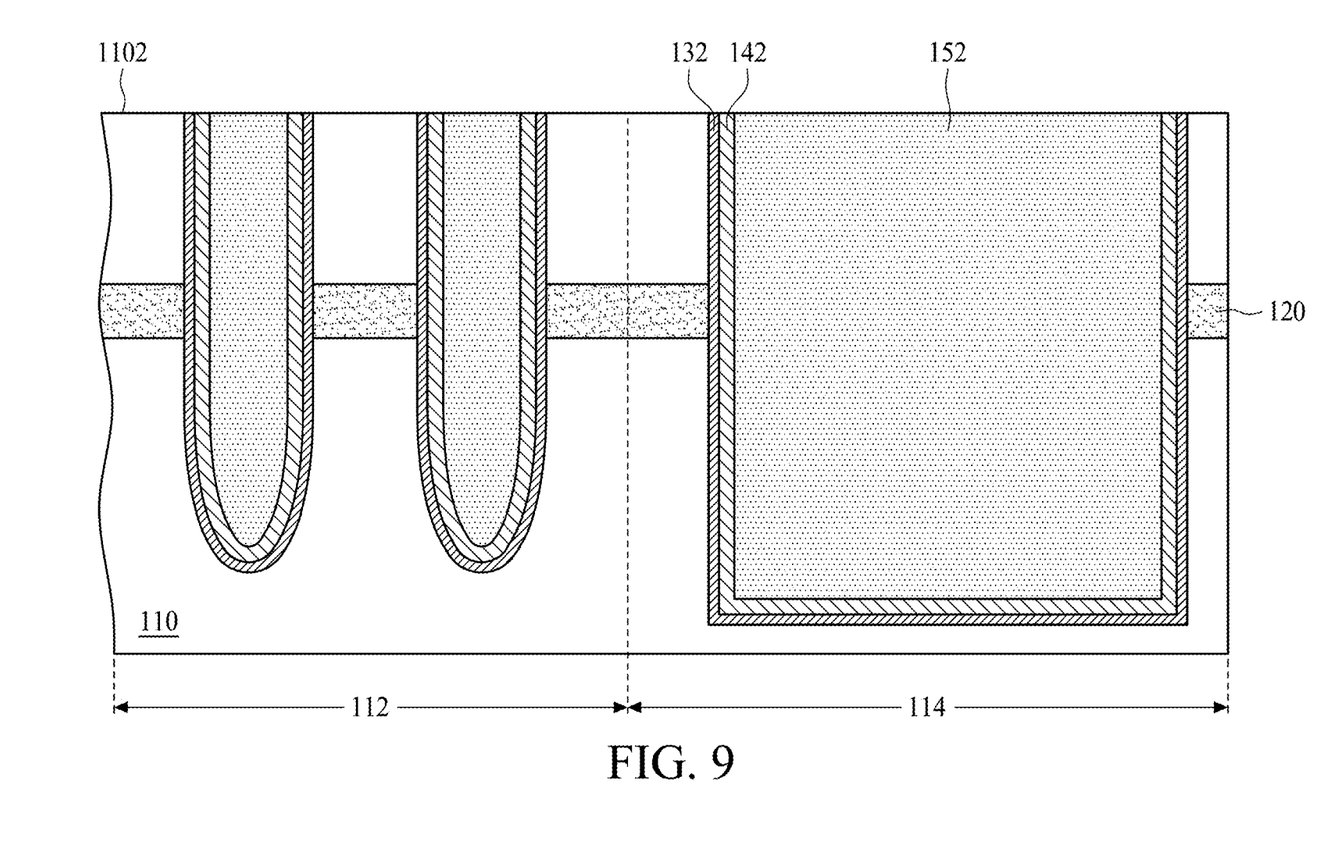
Figure 10:
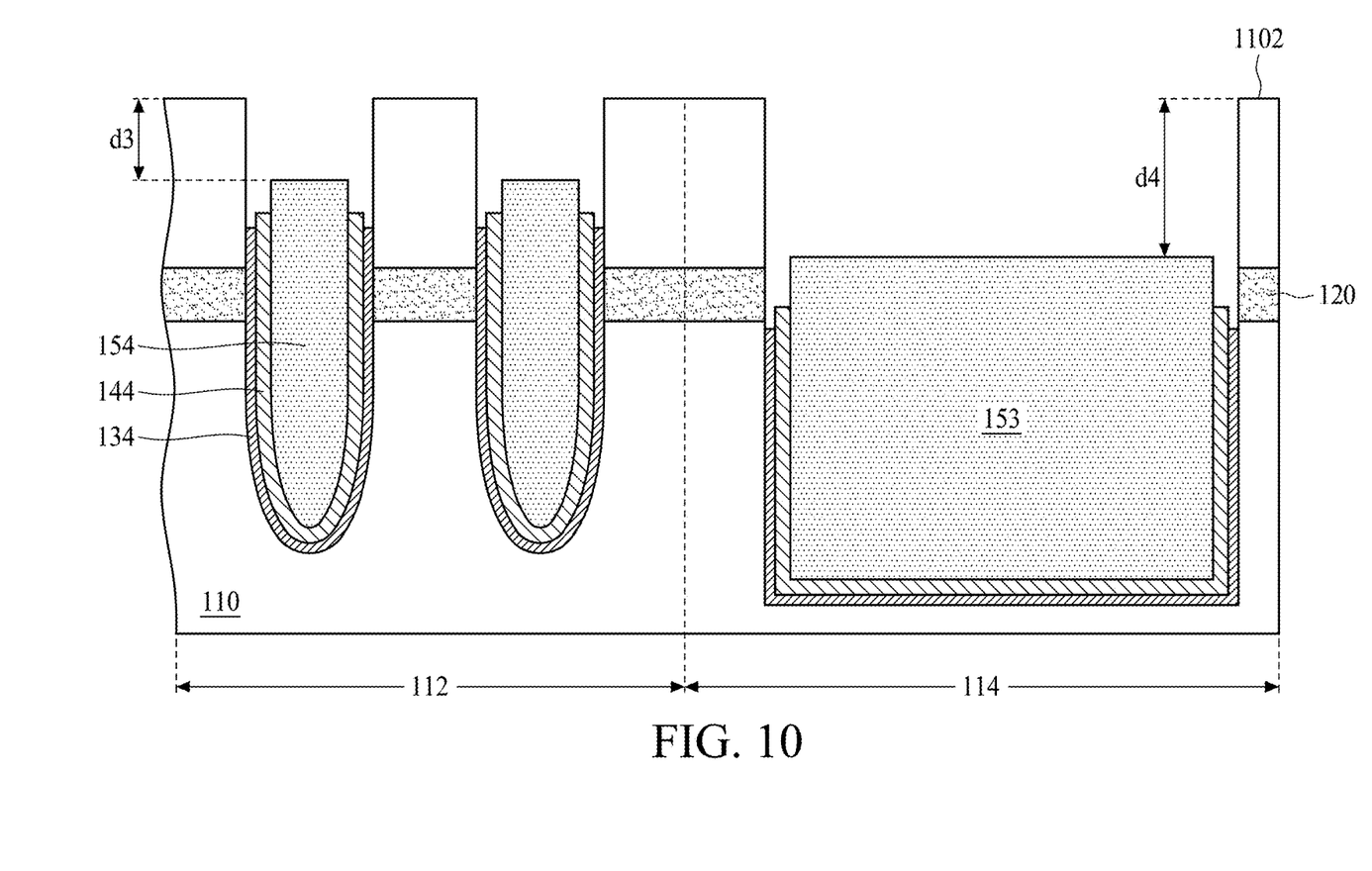

Referring to FIGS. 9 and 10, the electrode layer 150 is recessed below the upper surface 1102 of the semiconductor substrate 110 according to a step S316 in FIG. 2. Accordingly, a plurality of gate electrodes 154 are formed in the active area 112 and one or more dummy electrodes 153 are formed in the peripheral area 114. As shown in FIG. 9, the electrode layer 150, the diffusion barrier layer 140 and the dielectric film 130 may be polished using a chemical mechanical polishing (CMP) process, and the sacrificial layer 200 can be etched using one or more wet etching processes to expose the upper surface 1102 of the semiconductor substrate 110. As such, a polished electrode layer 152, a polished diffusion barrier layer 142, and a polished dielectric film 132 are formed.

The gate electrodes 154 and the dummy electrodes 153 shown in FIG. 10 can be formed by recessing the polished electrode layer 152 into the semiconductor substrate 110 using an etching process, such as an RIE process. The polished dielectric film 132 and the polished diffusion barrier layer 142 can be recessed, concurrent with the etching of the polished electrode layer 152, to form the dielectric liner 134 and the diffusion barrier liner 144. Once the buried layer 120 is exposed, the etching of the polished dielectric film 132, the polished diffusion barrier layer 142, and the polished electrode layer 152 stops. In other words, an endpoint detection step is performed for determining an end point of the etching process during the etching process, and the end point occurs when the material in the buried layer 120 is released into the etching chamber.

Due to the RIE lag effect mentioned above, an etching depth d3 of the polished electrode layer 152 in the active area 112 is less than an etching depth d4 of the polished electrode layer 152 in the peripheral area 114. As a result, the buried layer 120 in the peripheral area 114 can be preferentially exposed. That is, the depth of the buried layer 120 in the semiconductor substrate 110 and the widths of the first openings 230 and the second opening 240 in the sacrificial layer 200 can be controlled to adjust the height of the gate electrode 154 buried in the semiconductor substrate 110.

Figure 11:
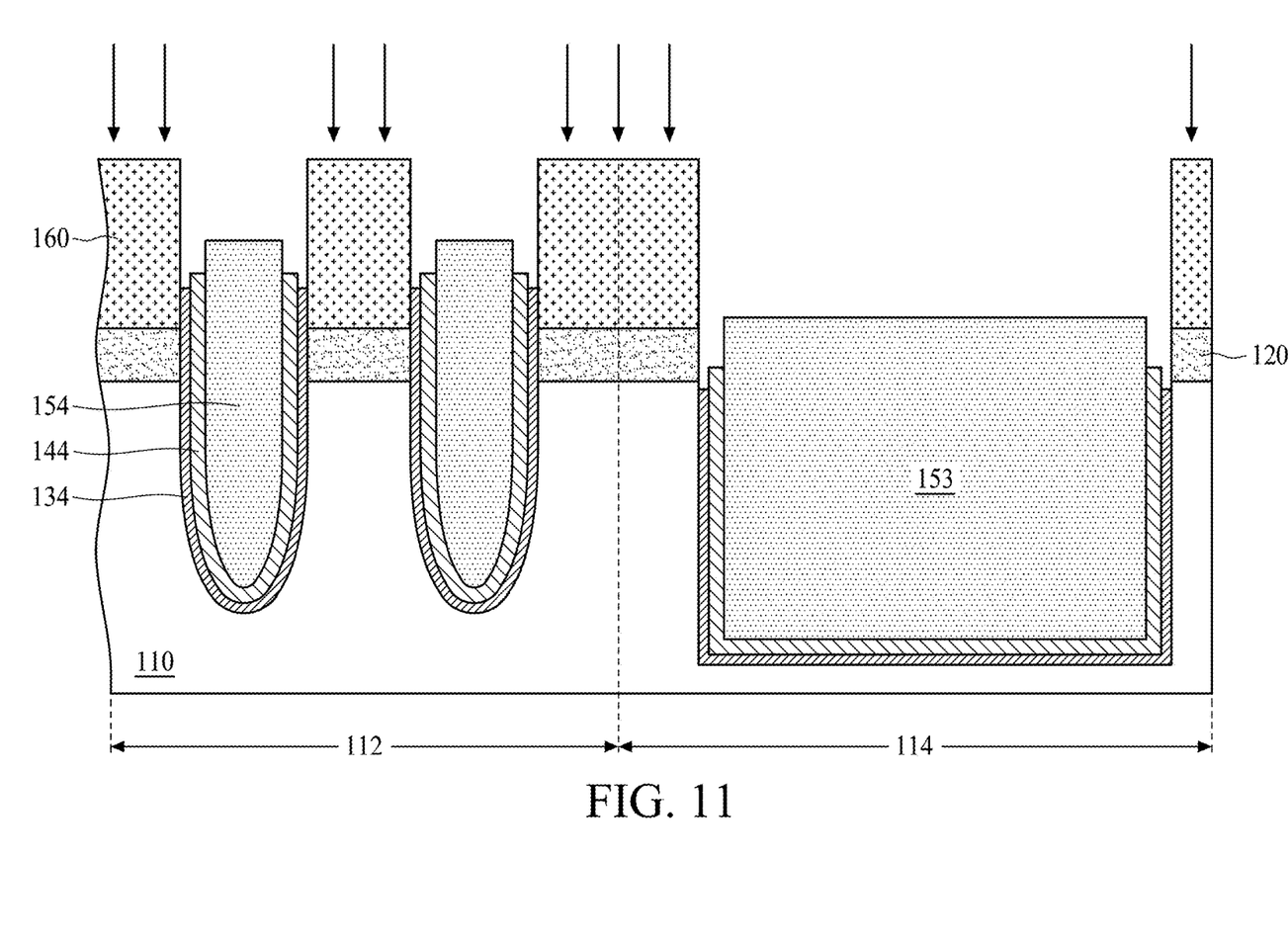

Referring to FIG. 11, dopants are introduced into the semiconductor substrate 110 to form impurity regions 160 on either side of the gate electrodes 154 according to a step S318 in FIG. 2. The impurity regions 160 can serve as source/drain regions of the transistor. The introduction of the dopants into the semiconductor substrate 110 is achieved by a diffusion process or an ion-implantation process. The dopant introduction may be performed using boron or indium if the respective transistor is a p-type transistor, or using phosphorous, arsenic, or antimony if the respective transistor is an n-type transistor. The buried layer 120 and the impurity regions 160 can be doped differently from each other in terms of the dopant concentration and/or the dopant type in order to shape the profile of the impurity regions 160. In some embodiments, the dopant concentration of the buried layer 120 may be greater than that of the impurity regions 160.

Figure 12:
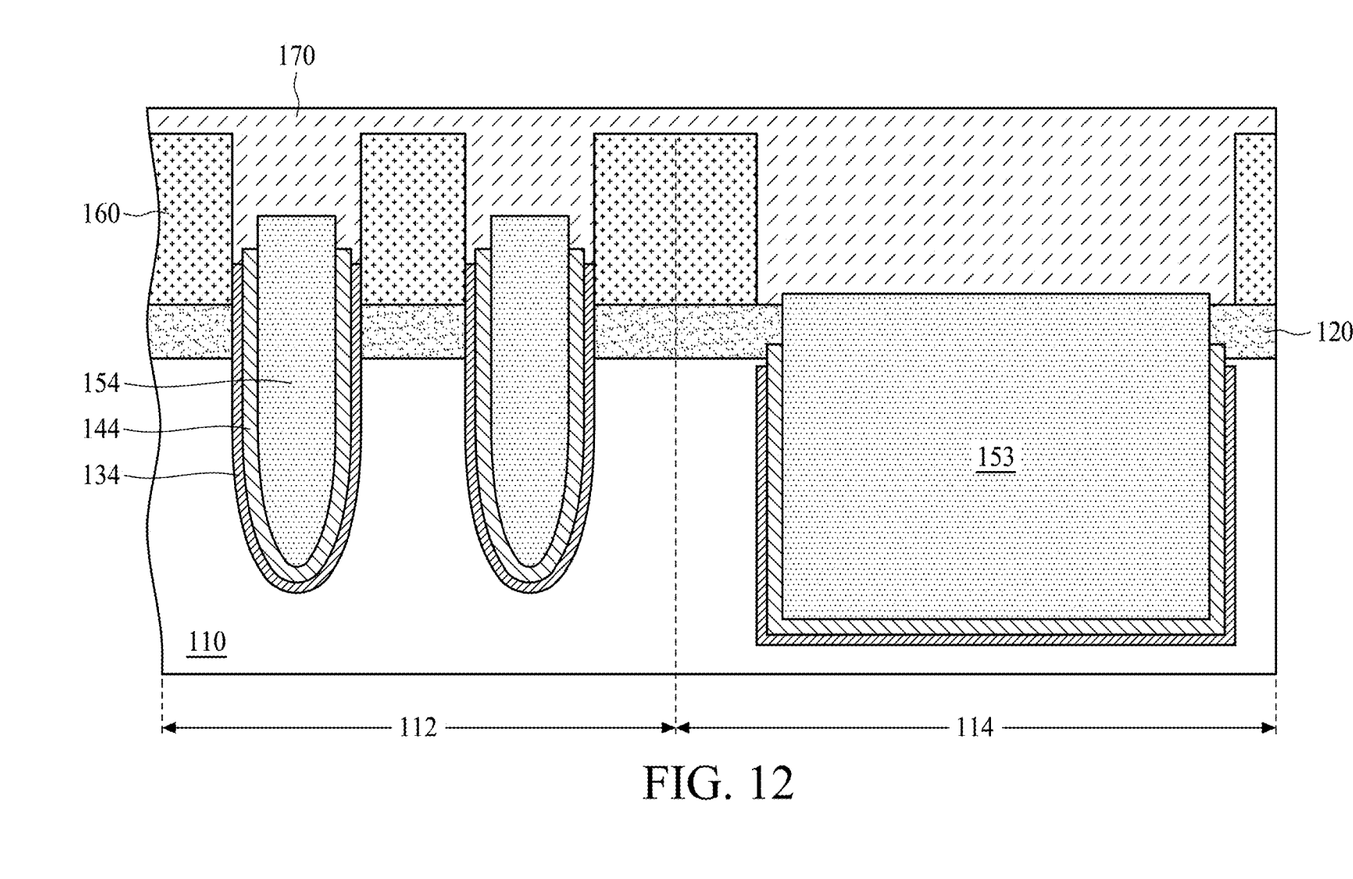

Referring to FIG. 12, a capping layer 170 is deposited on the gate electrode 154 and the dummy electrode 153 to protect the gate electrode 154 and the dummy electrode 153 according to a step S320 in FIG. 2. The capping layer 170 can be conformally disposed to fill the first trenches 116 and the second trenches 118 and cover the exposed semiconductor substrate 110. In some embodiments, the capping layer 170 includes high-density plasma oxide. In some embodiments, the capping layer 170 can be polished using a CMP process to expose the impurity regions 160. Accordingly, the semiconductor device 10 shown in FIG. 1 is completely formed.

In conclusion, the method of the present disclosure forms a buried layer 120, used for detecting an end point, in the semiconductor substrate 110, and forms the dummy electrode 153 having a relatively greater width, concurrent with the forming of the gate electrode 154, wherein the dummy electrode 153 has a width greater than the width of the gate electrode 154. As a result, the height of the gate electrode 154 can be controlled by adjusting the sizes of the first and second trenches for depositing the electrode layer, and adjusting a depth of the buried layer 120 in the semiconductor substrate 110. Therefore, the quality of the semiconductor device 10 can be improved.

One aspect of the present disclosure provides a semiconductor device. The semiconductor device includes a substrate comprising a buried layer, a gate electrode disposed in the substrate and penetrating through the buried layer, and a plurality of impurity regions disposed in the substrate and on either side of the gate electrode.

One aspect of the present disclosure provides a method of manufacturing a semiconductor device. The method comprises steps of forming a buried layer in a substrate; creating a plurality of first trenches and at least one second trench in the substrate and penetrating through the buried layer, wherein an aspect ratio of the first trenches is greater than an aspect ratio of the second trench; depositing an electrode layer to fill the first trenches and the second trench; recessing the electrode layer until the buried layer is exposed; and introducing dopants into the substrate to form impurity regions on the buried layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate comprising a buried layer, wherein a top surface of the buried layer is lower than a top surface of the substrate;
   a gate electrode disposed in the substrate and penetrating through the buried layer;
   a dummy electrode disposed in the substrate, wherein the buried layer is exposed through the dummy electrode, wherein a width of the dummy electrode is greater than a width of the gate electrode, and wherein the dummy electrode is disposed in a peripheral area laterally enclosing an active area in which the gate electrode is disposed, and the substrate extends to comprise the peripheral area and the active area; and
   a plurality of impurity regions disposed on the buried layer and on either side of a portion of the gate electrode that is above the buried layer.

2. The semiconductor device of claim 1, further comprising a capping layer covering the gate electrode and the dummy electrode and contacting the buried layer exposed through the dummy electrode.

3. The semiconductor device of claim 1, further comprising a dielectric liner interposed between the gate electrode and the substrate and between the dummy electrode and the substrate, wherein the dielectric liner in the active area further contacts the buried layer.

4. The semiconductor device of claim 1, wherein the impurity regions contact the buried layer.

5. The semiconductor device of claim 4, wherein a dopant concentration of the buried layer is greater than a dopant concentration of the impurity regions.

6. The semiconductor device of claim 1, wherein a thickness of the buried layer is less than a distance between an upper surface of the substrate and an upper surface of the buried layer.

7. A method of manufacturing a semiconductor device, comprising:
   forming a buried layer in a substrate, wherein a top surface of the buried layer is lower than a top surface of the substrate, and wherein the buried layer is formed by implanting dopants into the substrate;
   creating a plurality of first trenches and at least one second trench in the substrate and penetrating through the buried layer, wherein an aspect ratio of the first trenches is greater than an aspect ratio of the second trench;

depositing an electrode layer to fill the first trenches and the second trench;

recessing the electrode layer using a reactive ion etching (RIE) process until the buried layer is exposed; and introducing dopants into the substrate to form impurity regions on the buried layer and on either side of a portion of the electrode layer that is above the buried layer.

8. The method of claim 7, further comprising depositing a capping layer to cover the electrode layer after the recessing of the electrode layer.

9. The method of claim 7, wherein the buried layer is preferentially exposed through the electrode layer filling the second trench.

10. The method of claim 7, further comprising:

conformally depositing a dielectric film on the substrate which is exposed after the creating of the first trenches and the second trench; and conformally depositing a diffusion barrier layer on the dielectric film.

11. The method of claim 10, wherein the creating of the first trenches and the second trench comprises:

forming a sacrificial layer comprising a plurality of first openings and at least one second opening to expose portions of an upper surface of the substrate;

etching the substrate through the first openings and the second opening to form the first trenches and the second trench; and removing the sacrificial layer after the deposition of the electrode layer.

\* \* \* \* \*